United States Patent [19]

Melman et al.

[11] Patent Number: 5,300,794
[45] Date of Patent: Apr. 5, 1994

[54] METHOD OF FABRICATING HIGHLY LATTICE MISMATCHED QUANTUM WELL STRUCTURES

[75] Inventors: Paul Melman; Boris S. Elman, both of Newton; Emil S. Koteles, Lexington; Chirravuri Jagannath, Medfield, all of Mass.

[73] Assignee: GTE Laboratories Incorporated, Waltham, Mass.

[21] Appl. No.: 671,311

[22] Filed: Mar. 19, 1991

Related U.S. Application Data

[62] Division of Ser. No. 412,354, Sep. 25, 1989, Pat. No. 5,021,360.

[51] Int. Cl.$^5$ ............... H01L 29/161; H01L 29/205; H01L 29/225
[52] U.S. Cl. ...................... 257/190; 257/14; 257/15
[58] Field of Search ............. 357/16, 45 L; 257/14, 257/15, 190

[56] References Cited

U.S. PATENT DOCUMENTS

| | | | |
|---|---|---|---|
| 4,088,515 | 5/1978 | Blakeslee et al. | 357/16 |
| 4,558,336 | 12/1985 | Chang et al. | 357/16 |
| 4,769,341 | 9/1988 | Luryi | 357/16 |
| 4,835,583 | 5/1989 | Morioka et al. | 357/4 |
| 4,927,471 | 5/1990 | Okuda | 148/33.5 |
| 5,001,521 | 3/1991 | Okuda et al. | 357/4 |
| 5,003,548 | 3/1991 | Bour et al. | 372/45 |
| 5,053,835 | 10/1991 | Horikawa et al. | 257/190 |
| 5,057,880 | 10/1991 | Eshita et al. | 357/4 |

FOREIGN PATENT DOCUMENTS

| | | |
|---|---|---|
| 0279989 | 11/1987 | European Pat. Off. |
| 3605130 | 8/1986 | Fed. Rep. of Germany ......... 357/4 |
| 59-163883 | 9/1984 | Japan ..................... 357/4 |

OTHER PUBLICATIONS

Wada, O., et al. "Very High Speed GAINAS Metal–Semiconductor–Metal Photodiode . . . " Appl. Phys. Lett. Jan. 1989 pp. 16–18.

Hawley's Condensed Chemical Dictionary, 11th ed. Van Nostrand, 1987, p. 432.
K. Imanaka et al., "High-Efficiency AlGaAs/GaAs Single-Quantum-Well SemiconductorLaser with Strained Superlattice Buffer Layer", IEEE Photonics Tech. Letters vol. 1, Jan. 1989.
R. Hull et al., "Role of strained layer superlattices in misfit dislocation reduction ingrowth or epitaxial $Ge_{0.5}Si_{0.5}$ alloys on Si(100) substrates", Jour. of Applied Physics 65(1989) # 12, N.Y.
E. Kasper, et al., "Strain Adjustment in Si/SiGe Super Lattices", Mat. Res. Soc. Symp. vol. 102 1988, pp. 393–403.

(List continued on next page.)

Primary Examiner—Sara W. Crane
Attorney, Agent, or Firm—Victor F. Lohmann, III

[57] ABSTRACT

A method of fabricating a semiconductor heterostructure includes the growth of a quantum well active region that is highly lattice-mismatched relative to a substrate. A buffer layer having a thickness above a critical value is grown on the substrate whereby the stress due to a lattice constant mismatch between the buffer layer and substrate is relieved through the formation of misfit dislocations. A strained superlattice structure is grown on the buffer layer in order to terminate any upwardly-propagating dislocations. An unstrained barrier layer is subsequently grown on the superlattice structure. The fabrication method concludes with the growth of a quantum well structure on the unstrained layer wherein a lattice constant mismatch between the quantum well structure and the unstrained barrier layer is smaller than the lattice constant mismatch between the quantum well structure and the substrate. As a result, only a fraction of the stress due to the large lattice mismatch between the quantum well structure and the substrate is accommodated by coherent strain in the quantum well structure, while the remainder of the stress is relieved through the formation of misfit dislocations spatially separated from the quantum well structure.

6 Claims, 3 Drawing Sheets

OTHER PUBLICATIONS

H. Daembkes, "SiGe/Si: High Speed Devices", Proceedings on 2nd Intl. Symposium on Silicon MBE, pp. 25–27 (Oct. 1987).

Gourley et al., "Elmination of dark line defects in lattice-mismatched epilayers through use of strained-layer superlattices", Applied Phys. Lett 47 (5), pp. 482–484 (Sep. 1, 1985).

Feketa et al., "Graded-index separate-confinement in InGaAs/GaAs strained-layer quantum well laser grown by metalorganic chemical vapor deposition", Applied Phys. Lett 49(24), pp. 1659–1660, (Dec. 15, 1986).

Rogers et al. "High-Speed 1.3-um GaInAs Detectors Fabricated on GaAs Substrates". IEEE Electron. Device Lett. vol. 9 No. 10, pp. 515–517 (Oct. 1988).

Matthews et al., "Almost Perfect Epitaxial Multilayers," J. Vac. Sci. Technol., vol. 14, p. 989 (Jul./Aug. 1977).

Chai et al., "Molecular Beam Epitaxial Growth of Lattice-Mismatched $In_{.77}Ga_{.23}As$ on InP", J. Appl. Phys., 53(2) pp. 1229–1232 (Feb. 1982).

METHOD OF FABRICATING HIGHLY LATTICE MISMATCHED QUANTUM WELL STRUCTURES

This is a divisional of copending application Ser. No. 07/412,354 filed on Sep. 25, 1989, now U.S. Pat. No. 5,021,360.

FIELD OF THE INVENTION

This invention pertains to semiconductor heterostructures and, more particularly, to a method of growing quantum well structures having a controllable degree of lattice constant mismatch between the quantum well active region and the substrate due to the spatial separation of strain in the quantum well structure.

BACKGROUND OF THE INVENTION

Semiconductor superlattices and quantum well heterostructures (QWH's) form an important new class of electronic/optoelectronic materials since the properties of these layered structures are in many ways superior to those of bulk materials. While most superlattices and QWH's are grown using lattice-matched materials, structures comprised of lattice-mismatched heterolayers are also of considerable interest since they offer increased flexibility in choosing constituent materials while exhibiting some interesting properties due to the stress present in the structure.

For example, a heterostructure consisting of biaxially tensile stressed quantum wells can be used to control the light/heavy hole splitting energy and thus modify the effective mass of the charge carriers and the polarization properties of optoelectronic devices fabricated from these stressed heterostructures. Furthermore, changing the compositions and strain layers in these lattice-mismatched material systems permits a designer to selectively adjust the bandgap of the system. One such material system, formed by the growth of InGaAs quantum wells on a GaAs substrate, enables the fabrication of semiconductor lasers which operate in a wavelength range of 0.9 $\mu$m to 1.1 $\mu$m, a range not easily achieved in lattice matched structures.

Referring specifically to the effect of lattice mismatch in heterolayer structures, it is well known that the stress resulting from this mismatch can be accommodated solely by coherent strain in the heterolayers so long as the thickness of the individual heterolayers is below a critical value. This critical thickness is a function of alloy composition and strain, and is the thickness at which it becomes energetically favorable for misfit dislocations to occur, obviously an undesirable result if the material quality is to be maintained.

At present, conventional research has begun to demonstrate the feasibility of using lattice-mismatched quantum well structures in optical communication applications where large energy bandgap shifts are possible by varying the elastic strain due to lattice mismatches. However, as noted above, the quantum well structures must satisfy a critical thickness constraint that in turn limits the range of allowable bandgap shifts.

This constraint presents a particular problem to the designer who seeks, for example, to decrease the bandgap of a quantum well region to a range suitable for optical communications (1.1-1.3 $\mu$m) by increasing the alloy composition x of the quantum well region which, for exemplary purposes, may be an $In_xGa_{1-x}As$ single quantum well layer. However, the effect of increasing composition is to correspondingly decrease the critical thickness of the quantum well layers and thereby restrict the designer to the growth of only narrow wells. Unfortunately, narrow wells limit the range of achievable bandgap shifts.

With respect to specific conventional structures, Marioka et al. in U.S. Pat. No. 4,835,583 disclosed a semiconductor device which reduces the influence of lattice mismatch between the substrate and active region by growing a strained superlattice structure therebetween. Another conventional structure, proposed by Gourley et al. in Applied Physics Letters 47(5), 1985, pp. 482-484, attempts to eliminate misfit dislocations in a strained superlattice structure (SLS) epilayer by interposing a thick buffer layer between the SLS and the substrate. As a result, upwardly-propagating defects are confined to the first few layers of the SLS so that the upper layers are nearly free of dislocations.

OBJECTS OF THE INVENTION

It is a primary object of the present invention to obviate the above-noted and other disadvantages of the prior art.

It is a further object of the present invention to provide a novel fabrication method for growing quantum well heterostructures having a controllable degree of lattice constant mismatch between the quantum well active region and the substrate so that a wide range of achievable bandgaps is possible.

It is a further object of the present invention to fabricate a highly lattice-mismatched quantum well heterostructure by spatially distributing the strain in an interposed epitaxial structure whereby the growth of the individual quantum well layers is not limited by a stringent critical thickness requirement.

It is a yet further object of the present invention to provide a fabrication method capable of integrating optics and electronic in a monolithic structure characterized by high material quality and flexible bandgap ranges.

SUMMARY OF THE INVENTION

In one aspect of the present invention, a novel method of fabricating a semiconductor heterostructure includes the growth of a quantum well active region that is highly lattice-mismatched with respect to a substrate material. The method includes the step of growing a thick buffer layer on the substrate wherein the buffer layer is lattice-mismatched relative to the substrate and has a thickness above a critical thickness so that stress is relieved through the formation of misfit dislocations therein. Further fabrication steps include the growth of a strained superlattice structure on the buffer layer to terminate dislocations propagating through the buffer layer, and the growth of an unstrained barrier layer on this superlattice structure. A quantum well structure, such as a single quantum well layer or a multiple quantum well configuration, is grown on the unstrained barrier layer. A notable feature of this heterostructure is that the lattice constant mismatch between the quantum well structure and the barrier layer is smaller than the lattice constant mismatch between the quantum well structure and the substrate, a result not possible in conventional structures. This is significant in that only a fraction of the stress due to the large lattice constant mismatch between the quantum well structure and the substrate is accommodated by coherent strain in the quantum well structure, while the remainder of the stress is relieved in the buffer layer and the superlattice structure. Contradistinctively, the active region in a conventional lattice-mismatched system is required to fully accommodate the stress. Another advantage of the novel fabrication method concerns the spatial separation of the misfit dislocations from the quantum well structure, thereby preserving the quality of the active region.

BRIEF DESCRIPTION OF THE DRAWINGS

FIG. 2b is the SIMS profile of a sample having the indium concentration profile shown in FIG. 2a;

DETAILED DESCRIPTION OF THE PREFERRED EMBODIMENTS

The present application discloses a method of fabricating a heterostructure characterized by large lattice constant mismatch between the quantum well active region and the substrate material, and further characterized by the distribution of stress throughout an epitaxial structure formed between the quantum well region and the substrate. The significance of this method is that stress due to the large lattice constant mismatch between the quantum well region and the substrate is partially accommodated by misfit dislocations in the epitaxial structure so that only a fraction of the stress has to be accommodated through strain in the quantum wells. This consequently permits the fabrication of quantum well devices having large lattice constant mismatches without imposing a stringent critical thickness requirement on the quantum well layers. Moreover, the spatial separation of the dislocations from the quantum well regions preserves the high quality of the material.

Figure 1:
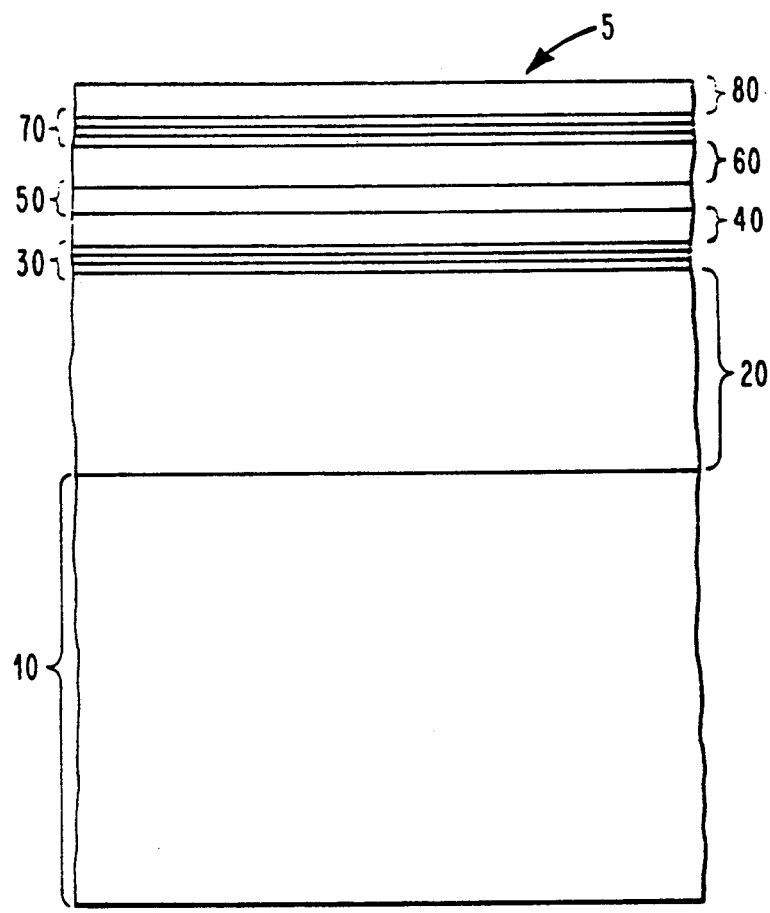
FIG. 1 is a sectional view of a semiconductor heterostructure in accordance with the present invention.

Referring now to the specific heterostructure fabricated from the novel method disclosed herein, FIG. 1 shows a profile view of a quantum well structure 5 grown in accordance with the present invention.

As shown, the structure 5 consists of a sequence of semiconducting layers overlaying a suitable conventional substrate 10 and grown in accordance with the present invention. Initially, a thick buffer layer 20 of semiconducting material is grown on substrate 10 wherein an intentional lattice constant mismatch exists between layer 20 and substrate 10. The thickness of layer 20 is designed to be above a critical thickness value so that the stress in this layer due to the lattice constant mismatch with substrate 10 is relieved through the formation of misfit dislocations therein. The thickness of layer 20 is sufficiently greater than the critical thickness so that the top part of layer 20 has a lattice constant of a free standing layer. A strained superlattice structure 30 is then grown on layer 20 in order to terminate any dislocations which may have propagated to the upper surface of layer 20, thereby confining the dislocations to buffer layer 20. At this point in the fabrication of structure 5, one has effectively created a high quality substrate 10-20-30 having a modified lattice constant.

Subsequent to the growth of strained superlattice structure 30 is the formation of a quantum well active region 40-50-60. As shown, the quantum well structure consists of a well barrier layer 40 grown on superlattice structure 30, a single quantum well active layer 50 grown on barrier layer 40, and a second well barrier layer 60 grown on quantum well layer 50. The barrier layer 40 is completely unstrained due to the confinement of dislocations by the superlattice structure 30. Although the quantum well region is shown illustratively as a single quantum well 50, it should be well known to those skilled in the art that other quantum well regions, such as a multiple quantum well, could be grown in accordance with the present invention.

A significant feature of the quantum well structure 40-50-60 is that the lattice constant mismatch between well layer 50 and barrier layer 40 is smaller than the lattice constant mismatch between the well layer 50 and substrate 10, thereby allowing a variety of high quality quantum well structures to be grown even though a large lattice constant mismatch exists with respect to the substrate. The stress resulting from this large mismatch, as noted hereinbefore, is partially accommodated in the buffer layer 20 by misfit dislocations spatially separated from the active region, while only a fraction of the stress is accommodated by strain in the quantum well layer 50. In this manner, the well material can be designed to be stressed by an arbitrarily reduced amount, depending on the design goals and other device considerations. The distribution of stress is a particularly advantageous feature when one considers the fact that stress in a conventional lattice-mismatched structure having a quantum well structure grown directly on a substrate is accommodated entirely by strain in the quantum well region.

Although a number of different growth steps following the formation of quantum well structure 40-50-60 can be used to complete the fabrication of device 50, FIG. 1 shows for exemplary purposes only that a second superlattice structure 70 is grown on barrier layer 60 and a cap layer 80 is then grown on superlattice structure 70.

Since the method disclosed herein can be applied to a variety of suitable material systems, the following data regarding a sample grown in accordance with the present invention serves to represent just one of many structures which may be grown, with others suggesting themselves to those skilled in the art. Specifically, the substrate 10 is grown from GaAs with the overlaying buffer layer 20 being a 1$\mu$-thick layer of In$_{.3}$Ga$_{.7}$As. Superlattice structures 30 and 70 are each grown from twenty periods of GaAs/In$_{.3}$Ga$_{.7}$As wherein each of the alternating layers is 20Å thick. Furthermore, each of the barrier layers 40 and 60 is a 0.3$\mu$-thick layer of In$_{.3}$Ga$_{.7}$As, while the single quantum well layer 50 is grown from In$_{.5}$Ga$_{.5}$As and has a thickness of 60Å. The cap layer is grown from GaAs. The buffer layer 20, barrier layer 40, and the InGaAs heterolayers in superlattice 30 have the same composition so that no lattice constant mismatch will exist between the adjacent layers.

A further improvement to the structure of FIG. 1 consists of growing a superlattice buffer structure on the barrier layer 40 prior to growth of the quantum well layer 50. Grading the composition of the individual layers in this superlattice buffer structure permits the growth of a high quality quantum well without growth interruptions at the interfaces.

A first and second preferred embodiment of the present invention (hereinafter referred to as sample A and sample B, respectively) were fabricated in accordance with the improvement mentioned above wherein a compositionally graded superlattice structure is formed between the barrier layer and the quantum well layer. The growth parameters of sample A and sample B are set forth below for illustrative purposes only, and should not operate to limit the invention to these particular samples.

Figure 2A:
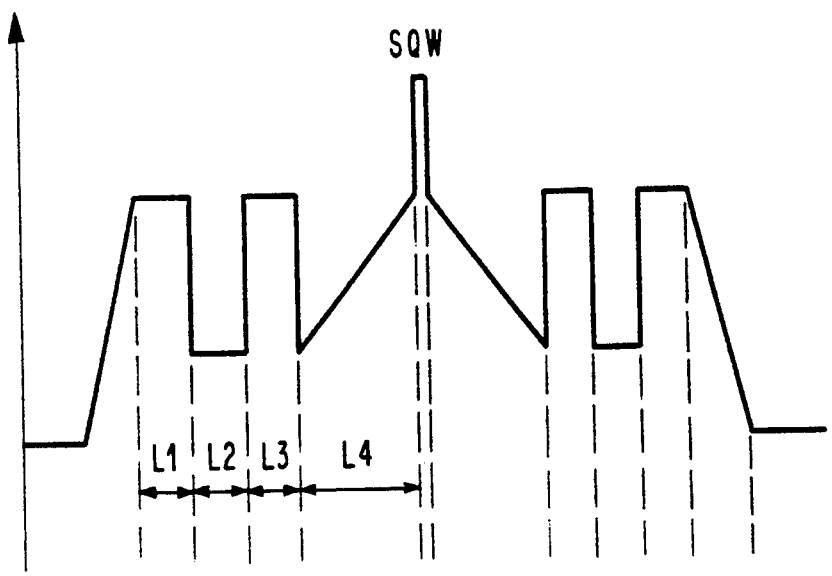
FIG. 2a shows the average indium concentration profile versus depth for a sample grown in accordance with a first preferred embodiment of the present invention.
Figure 2B:
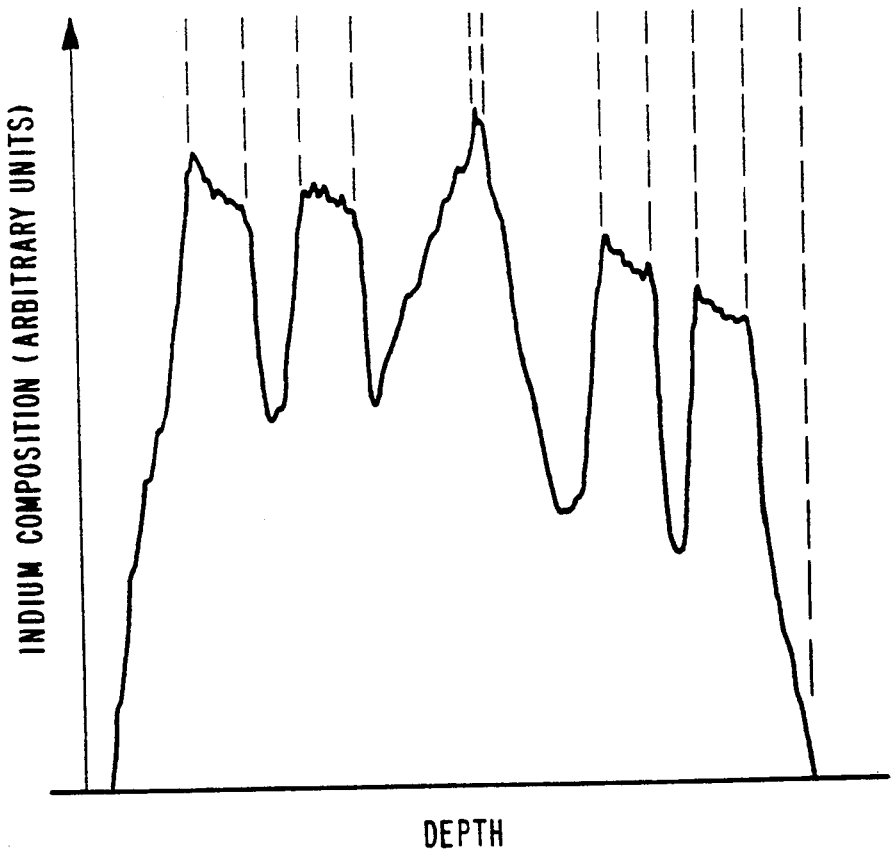

FIG. 2a shows the profile of indium composition versus depth in each sequential layer of sample A. The structure was grown by molecular beam epitaxy on a (001) semi-insulating GaAs substrate at a substrate temperature of 530° C. and a GaAs growth rate of approximately 0.5 $\mu$m/hr. As shown, a thick buffer layer of InGaAs (thickness $L_1$) is grown with indium composition $x_1$ well above the critical thickness. A strained layer superlattice (thickness $L_2$) consisting of ten periods of 20Å InGaAs (composition $x_1$) separated by 20Å of GaAs is then grown on the buffer layer. An unstrained layer (thickness $L_3$) is then grown with the same indium composition, $x_1$, as the buffer layer. A subsequently grown superlattice structure having thickness $L_4$ consists of thirty-five periods of 20Å InGaAs (composition graded from $x_1$ to $x_2$) separated by 20Å of GaAs. This structure serves as the barrier layer for the 60Å single quantum well (labeled SQW) grown with indium composition $x_2$. As indicated in FIG. 2a, another sequence of layers is grown above the single quantum well SQW wherein the thicknesses and compositions of these layers are symmetrical about the quantum well. In sample A, the compositions $x_1$ and $x_2$ are 30% and 50%, respectively, while in Sample B, $x_1$ and $x_2$ are 23% and 45%, respectively. The indium composition versus depth profile, measured by a secondary ion mass spectroscopy (SIMS), is shown in FIG. 2b for sample A and indicates good replication of the designed layer sequence. Only an average indium concentration appears in this trace since the SIMS depth resolution is insufficient to show the individual layers in the 20Å/20Å superlattices.

The major feature of this structure is that the strain in the quantum well is due to the difference between the lattice constants of the InGaAs layers in the SQW and the superlattice structure of thickness $L_4$, with this quantity being proportional to the indium concentration difference of $x_2 - x_1$, rather than due to the large difference between lattice constants of the well and bulk GaAs, where the indium concentration difference is $x_2$—O. This permits the growth of an elastically strained quantum well layer of much larger thickness than would be possible if the active region were grown directly on the GaAs substrate.

Figure 4:
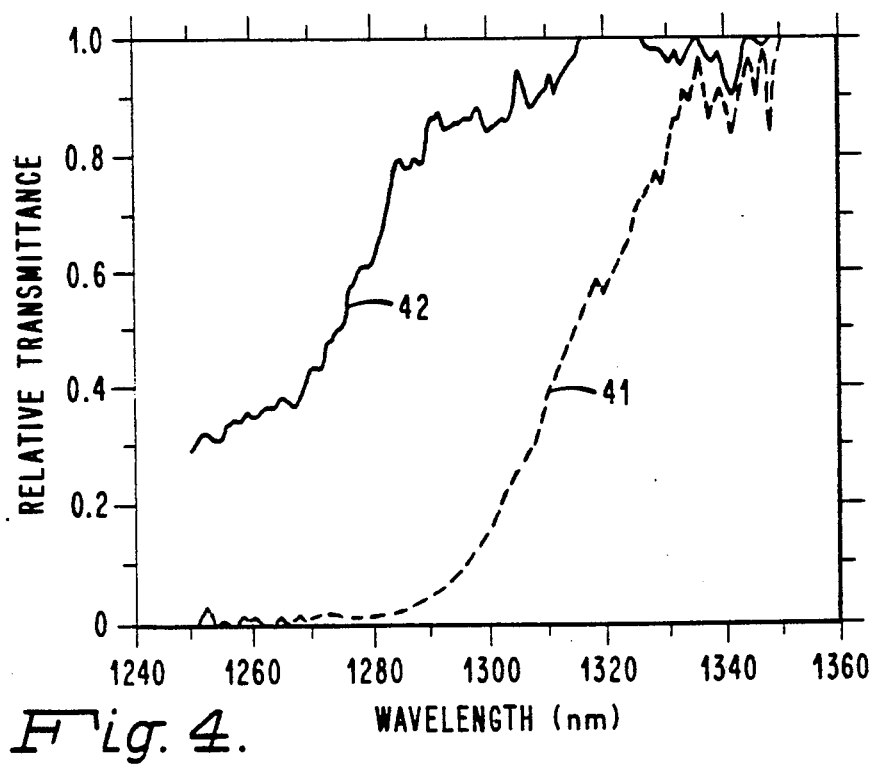
FIG. 4 is the transmission spectra of the sample grown in accordance with the first preferred embodiment.
Figure 3:
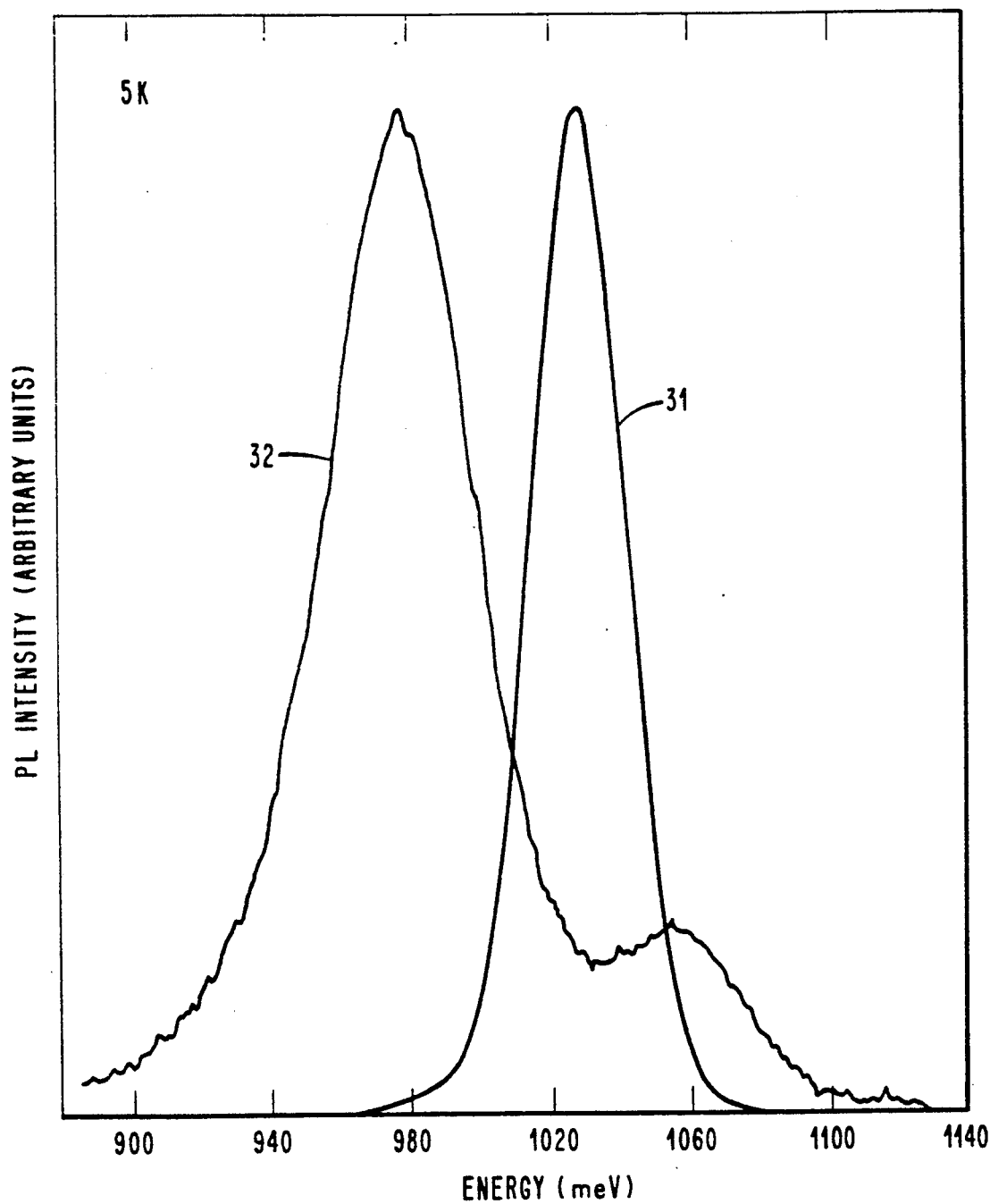
FIG. 3 graphically compares the low temperature spectra of the sample corresponding to FIG. 2a with another sample grown in accordance with a second preferred embodiment of the present invention.

The low temperature (15K) photoluminescence spectra of samples A (curve 31) and B (curve 32) are shown in FIG. 3. An 8 mW HeNe laser was used for excitation. The peak wavelengths, extrapolated to room temperature, are 1.32 $\mu$m for sample A and 1.39 $\mu$m for sample B. The additional peak in spectrum B is due to luminescence by the superlattice surrounding the quantum well. The width of the PL peaks is about an order of magnitude larger than that observed for low composition pseudomorphic QWs grown under the same conditions. This broadening is probably due to spatial nonuniformities in the strain which produces a spectrum of bandedges in the structure, and indicates the presence of some dislocations in the well. This is most likely due to an incomplete termination of misfit dislocations by the superlattice. A strain symmetrized SLS as disclosed by G. Abstreiter et al. in Journal de Physique, 3rd International Conference on Modulated Semiconductor Structures, pp. C5-321 to C5-327 (1987) should provide a much better buffer which should result in a better quality well. It should be noted that the index of refraction of InGaAs is higher than that of GaAs, and therefore this structure constitutes a planar waveguide. This permits measurements in the waveguiding configuration by endfire-coupling light into the structure. The room temperature transmission spectra of sample A for light propagating in the quantum well plane for both TE (E-field parallel to QW plane) and TM (E-field perpendicular to QW plane) polarizations is shown in FIG. 4 as curves 41 and 42, respectively. The bandedge is observed to be at about 1.3 $\mu$m. The relatively soft absorption edge is consistent with the wide PL emission peak. The indicated difference between the TE and TM absorption is due to the difference in the transition selection rules of the light and heavy hole states in the well and confirms that the absorption occurs in the quantum well.

As an example of the advantage of the disclosed fabrication method over conventional growth techniques, first consider the aforementioned conventional structure wherein an InGaAs layer is grown directly on a GaAs substrate. The lattice constant mismatch of this structure varies between 0% and 7% and depends almost linearly on the indium concentration, while the bandgap of the InGaAs single quantum well depends on both the indium concentration and the well thickness. If one is interested in decreasing the bandgap so that it falls within the range of interest (1.3 $\mu$m to 1.5 $\mu$m) for fiber optic communication systems, the indium concentration must exceed 50%. However, this particular indium concentration sets the critical thickness at 12Å, and thereby imposes an upper limit on the thickness of any quantum well layer which is to be grown without creating dislocations. Disadvantageously, the quantum well layers that are grown in compliance with this critical thickness requirement have bandgaps exceeding the range of interest. With the fabrication method disclosed herein, the same indium concentration can be used to achieve the desired bandgap energy change mentioned above since the lower strain accommodated by the quantum well results in a higher critical thickness value and thus permits the growth of thicker wells layers having the desired bandgap values.

A second example of the usefulness of this method is in the design of strained quantum well lasers, where it has been shown that large strain is needed to lower the effective mass of the valence band. The reduction of this parameter results in a lowering of the lasing threshold, an increase in the speed of operation, and improved differential quantum efficiency. However, the need for large strains in these structures imposes limitations on the bandgap values achievable, unless one can spatially distribute the strain as in the present invention.

In summary, strained InGaAs quantum wells with absorption edges between 1.3 $\mu$m and 1.4 $\mu$m at room temperature were grown on GaAs substrates using the novel fabrication method disclosed herein for spatially separating the strain. Application of this method makes it possible to fabricate long wavelength devices on GaAs substrates and therefore is useful in integrating optics and electronics in a monolithic structure as well as in extending the range of wavelengths that can be achieved using strained layer structures.

What is claimed is:

1. A semiconductor heterostructure, comprising:
   a host substrate;
   a buffer layer of uniformly compositioned semiconducting material grown on said substrate wherein said layer is lattice-mismatched relative to said substrate;
   a strained superlattice structure grown on said buffer layer wherein said host substrate, said buffer layer, and said superlattice structure together form an effective substrate;
   an unstrained barrier layer grown on said superlattice structure; and
   a quantum well structure serving as an active region and grown on said barrier layer;
   wherein said uniformly compositioned buffer layer has a thickness greater than a critical thickness such that stress due to a lattice constant mismatch between said quantum well structure and said host substrate is accommodated by the formation of dislocations in said uniformly compositioned buffer layer.

2. The semiconductor heterostructure as recited in claim 1 further includes:
   an upper barrier layer grown on said quantum well structure; and
   a superlattice structure grown on said upper barrier layer.

3. The semiconductor heterostructure as recited in claim 1 wherein the unstrained barrier layer includes:
   a semiconductor layer of uniform composition; and
   superlattice structure grown on said uniform compositional layer and having a graded composition.

4. The semiconductor heterostructure as recited in claim 1 wherein:
   said superlattice structure is strain symmetrized.

5. The semiconductor heterostructure as recited in claim 2 further includes
   a cap layer grown on the superlattice structure grown on said upper barrier layer.

6. The semiconductor heterostructure as recited in claim 1 wherein
   a lattice constant mismatch between said quantum well structure and said barrier layer is smaller than the lattice constant mismatch between said quantum well structure and said host substrate.

* * * * *